United States Patent [19]
Bouton

[11] Patent Number: 5,633,784
[45] Date of Patent: May 27, 1997

[54] APPARATUS FOR CONTROLLLING AND OPERATING AN ELECTRIC MOTOR, FOR EXAMPLE IN AN AUTOMOBILE

[75] Inventor: Joel Bouton, Eragny sur Oise, France

[73] Assignees: Automobiles Peugeot, Paris; Automobiles Citroen, Neuilly sur Seine, both of France

[21] Appl. No.: 393,275

[22] Filed: Feb. 23, 1995

[30] Foreign Application Priority Data

Feb. 28, 1994 [FR] France ................... 94.02275

[51] Int. Cl.⁶ ................................................ H05K 7/20
[52] U.S. Cl. ..................... 361/716; 174/15.1; 361/689
[58] Field of Search ................ 310/68 C; 165/104.26, 165/104.33, 80.3, 80.4, 185; 257/712–714, 723, 724; 62/259.2; 174/15.1, 16.1, 16.3, 252; 361/689, 690, 699, 702, 707, 715, 716

[56] References Cited

U.S. PATENT DOCUMENTS

| | | | |
|---|---|---|---|
| 3,952,231 | 4/1976 | Davidson | 317/100 |
| 3,999,105 | 12/1976 | Archey | 317/100 |
| 4,315,300 | 2/1982 | Parmerlee | 361/382 |
| 4,631,636 | 12/1986 | Andrews | 361/385 |
| 5,023,695 | 6/1991 | Umezawa | 357/82 |
| 5,316,077 | 5/1994 | Reichard | 361/699 |
| 5,380,956 | 1/1995 | Loo | 174/252 |

FOREIGN PATENT DOCUMENTS

| | | | |
|---|---|---|---|
| 0083538 | 7/1983 | European Pat. Off. | 361/699 |
| 0514141 | 11/1992 | European Pat. Off. . | |
| WO93/23266 | 11/1993 | WIPO . | |

OTHER PUBLICATIONS

"Liquid Cooling—Chips", Anacker, IBM Tech Disc Bull vol. 20 No. 9 Feb. 1978 p. 3742.
Patent Abstracts of Japan, vol. 17, No. 75 (E–1320), 15 Feb. 1993, & JP-A-04 275 492 (Oki Ryoji). 1 page.
Patent Abstracts of Japan, vol. 13, No. 474 (E–836), 26 Oct. 1989, & JP-A-01 186 175 (Nakajima Kyoichi) 25 Jul. 1989. 1 page.

*Primary Examiner*—Gerald P. Tolin
*Attorney, Agent, or Firm*—Burns, Doane, Swecker & Mathis, L.L.P.

[57] ABSTRACT

An operating and control device, for example for an electric motor, includes a support having by a first metal part in which is formed a network of conduits conveying a cooling fluid for electrical elements, and a second part, made of insulating material, housing electrical links for connections with those electrical elements, a source of energy and other electrical components. The invention applies in particular to automobiles with an electric motor.

14 Claims, 4 Drawing Sheets

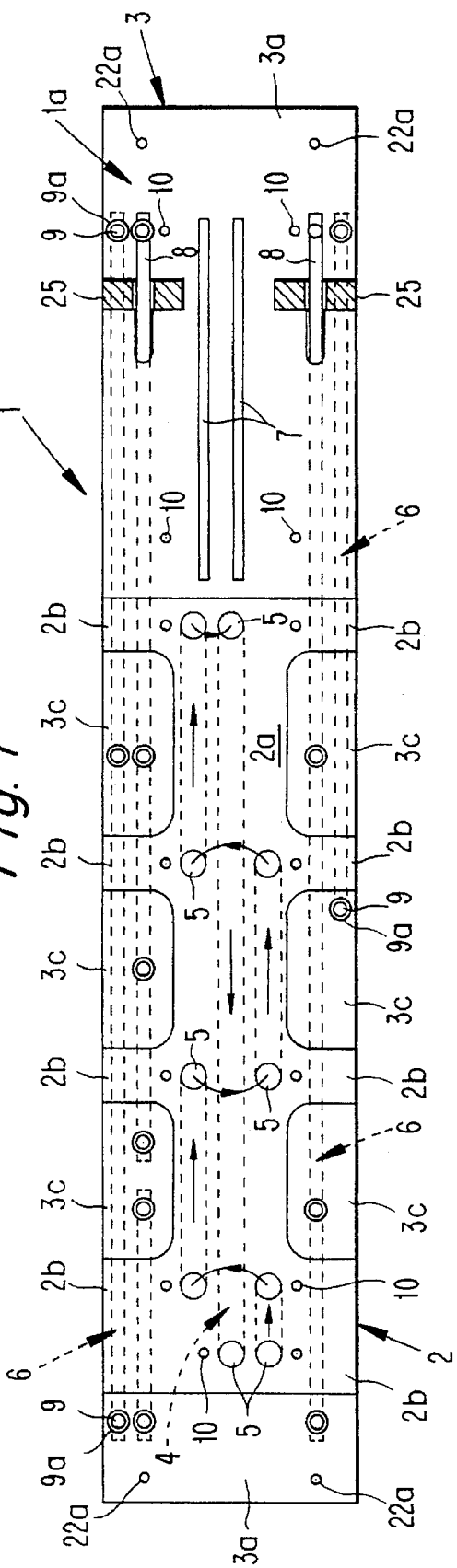
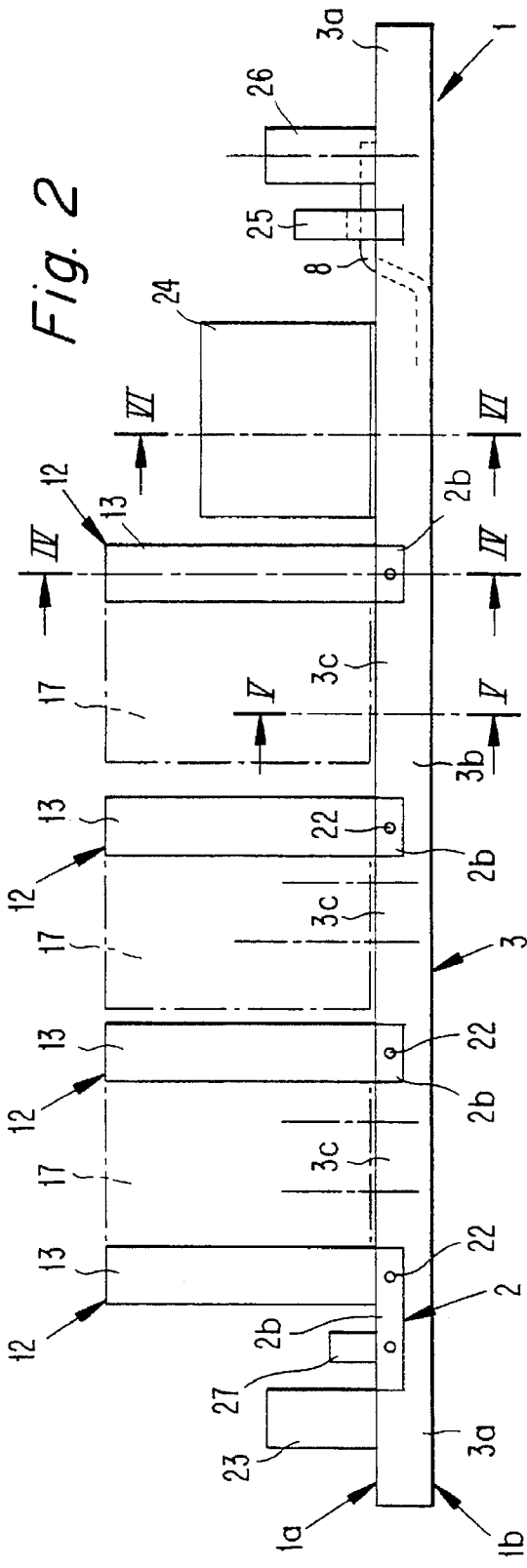

APPARATUS FOR CONTROLLLING AND OPERATING AN ELECTRIC MOTOR, FOR EXAMPLE IN AN AUTOMOBILE

BACKGROUND OF THE INVENTION

The present invention refers to an operating and control device for an electric motor, namely for an automobile.

The operation and control of an electric motor are effected by means of electrical elements such as choppers, converters, chargers and contactors that are connected on the one hand to a source of energy and, on the other hand, to other electric apparatuses.

We already know of an operation and control device making it possible to group, on a single support, a set of electric elements connected together and capable of being connected in particular to an electric motor and to a source of energy, where these electric elements are also connected by pipes to a cooling circuit.

In this known device, hydraulic cooling pipes are generally attached to the elements by collars or clamping bows and the electrical connection is effected by electric links attached to the elements by means of screws and nuts.

However, the aforementioned attachment of the cooling pipes is constraining and burdensome, and fluid leaks can occur as a result of the vibrations of the motor or the associated vehicle.

Moreover, the aforementioned fasteners of the electric links also present numerous disadvantages, including for example a risk of supply interruption or short-circuit by loosening of the fasteners resulting from the vibrations of the vehicle or the motor, as well as a risk of overheating of the electric links and thus of electric losses resulting from poorly tightened fasteners.

OBJECTS AND SUMMARY OF THE INVENTION

An object of the present invention is, therefore, to avoid the aforementioned disadvantages and to provide an operating and control device for an electric motor that allows a simple, quick connection of the electric elements on a support, and that presents good electric insulation as well as good watertightness against the cooling fluid.

To achieve this object, the present invention includes an operating and control device for an electric motor, in particular for an automobile. This device comprises means of support for electrical elements capable of being connected to a source of energy and to other electric components by means of electrical links, and a network of pipes conveying a cooling fluid for these electrical elements. The device is further characterized in that this means of support includes a first metal part in which this network of pipes is formed, and a second part, made of insulating material, housing these electric links for their connection with the electrical elements, the source of energy and the other electrical components.

The invention thus makes it possible to integrate in a single support the hydraulic network and the electrical links simultaneously.

According to an advantageous characteristic of the invention, the means of support presents, on an upper face, pipe exit and entry openings or ports arranged in the first metal part and electrical contact zones formed in the second part. Thus, the means of support makes it possible (i) to hydraulically connect these pipes to cooling circuits formed in electric element support bases as well as (ii) to electrically connect these electrical links to the electrical elements mounted on said bases, to said source of energy, and to the other electric components, whereby each base belongs to a series of modules of predetermined shapes and adapted to the different openings and contact zones of the means of support.

According to another characteristic of the invention, the second, insulating part, is duplicate moulded on the first metal part.

According to yet another characteristic of the invention, each base advantageously includes means of attachment for at least one electric element and for at least one electrical connector able to engage with one of these contact zones to assure the electric connection between the electrical elements and the electrical links.

The invention thus makes it possible to produce a modular device assuring a quick, reliable connection of the electrical elements on a single support.

The aforementioned electrical connectors can comprise a mobile or portable base connected elastically via conductors to the electrical elements by means of springs and braidings, to assure a quick, reliable contact, which avoids damaging the means of support or the connectors.

According to another characteristic of the invention, each contact zone is made as a perforation emerging at one end on an electrical link, with its other end diverging roughly in the manner of a truncated cone, for example, for guiding the bases of the electric connectors.

Metal bars advantageously constitute the electrical links and are at least partially embedded in longitudinal housings of the second part, preferably in grooves arranged on the external lower surface of the means of support.

The means of support may also include, on its upper face, means such as pins for attaching the electrical element support bases.

The device of the invention may also include mechanical means of attaching the means of support on an automobile, for example.

An object of the present invention is also a support such as the one described above. The support can advantageously be used to produce a battery of electric accumulator elements, whereby each element is mounted on the support in the same way as the aforementioned electrical elements.

BRIEF DESCRIPTION OF THE DRAWINGS

The invention itself will be better understood through the following explanatory description of two particular, presently preferred methods of execution of the invention. These embodiments are provided solely as non-limiting, illustrative examples. Many other objects and advantages of the present invention will be apparent to those skilled in the art when this specification is read in conjunction with the accompanying drawings werein like reference numerals are applied to like elements and wherein:

FIG. 1 is a top plan view of the means of support of the device of the invention;

FIG. 2 is a side elevational view of the device of the invention;

DESCRIPTION OF THE PREFERRED EMBODIMENTS

Figure 3:
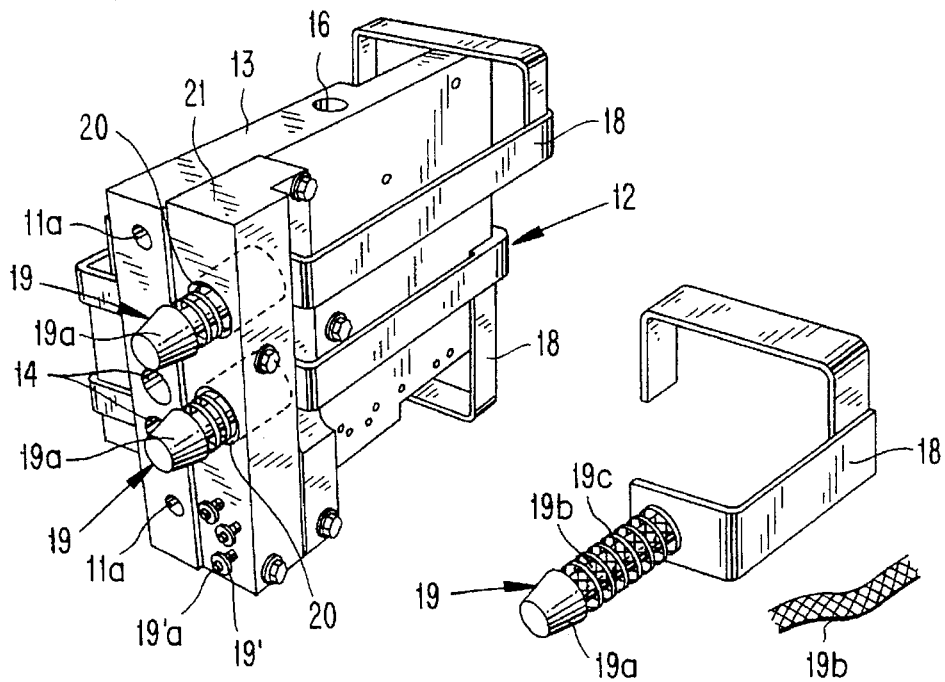
FIG. 3 is an exploded view of a first embodiment of the module of the device of the invention.

According to the exemplary embodiment represented in FIG. 1, the device of the invention includes a support plate or sole 1 having a first metal part 2 a second part 3. The support plate may be fashioned from aluminum, for example. The second part 3 is made of a suitable insulating material and has been duplicate moulded.

Of course, the second, insulating part may also be produced by injection molding or by a process other than duplicate moulding.

The support plate 1 has an upper face 1a as illustrated in FIG. 1.

The first metal part 2 presents a longitudinal central body 2a from which tabs 2b protrude laterally at the level of the upper face 1a; these tabs are spaced in the longitudinal direction of the support plate 1 according to a predetermined spacing that can be of variable length.

The second, insulating part 3 has a complementary shape that fits partly under the first metal part 2. This second, insulating part 3 includes two end portions 3a that longitudinally grip the first metal part 2. These end portions 3a are linked by two intermediary, lateral portions 3b (see FIG. 2) that laterally grip the central body 2a of the first metal part 2. The intermediary, lateral portions 3b have protuberances 3c (see FIG. 1) that protrude toward the upper face 1a between the aforementioned tabs 2b.

A network of hydraulic pipes 4 is arranged in the central body 2a of the aforementioned first metal part 2, for example during the moulding or by machining the metal part.

These pipes 4 emerge on the upper face 1a by means of cooling fluid exit and entry openings 5. These exit and entry openings 5 are arranged at each end of the pipes 4, respectively.

The arrows in FIG. 1 illustrate, in a non-limitative way, the circulation path and the direction of the cooling fluid inside the network of pipes 4.

Longitudinal grooves 6 are formed in the lateral portions 3b of the second, insulating part 3 at the level of the lower face 1b. Other longitudinal grooves 7 are arranged in one of the end portions 3a of the second, insulating part 3 at the level of the upper face 1a.

Figure 4:
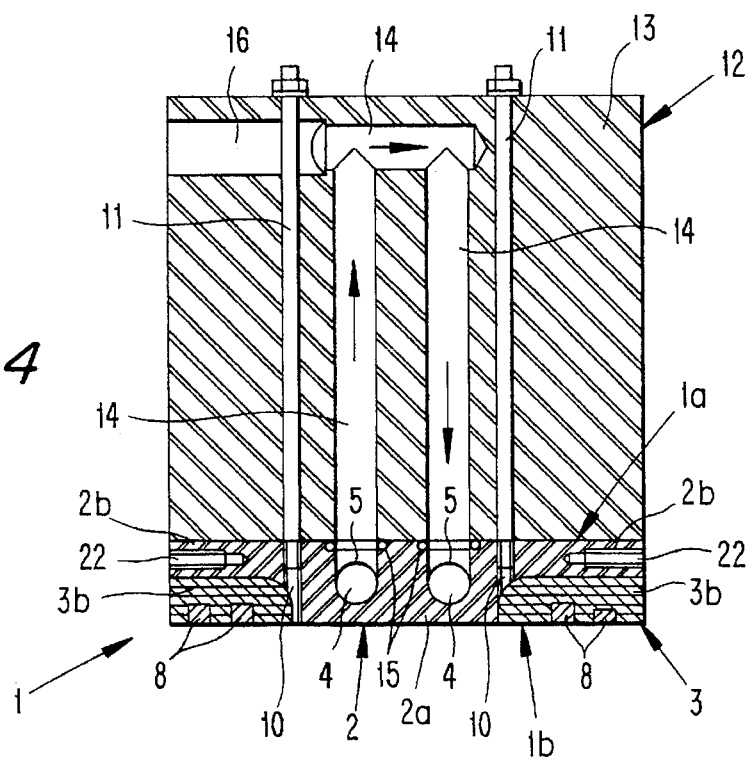
FIG. 4 is a cross-sectional view of the device of the invention, taken along the line IV—IV of FIG. 2.
Figure 5:
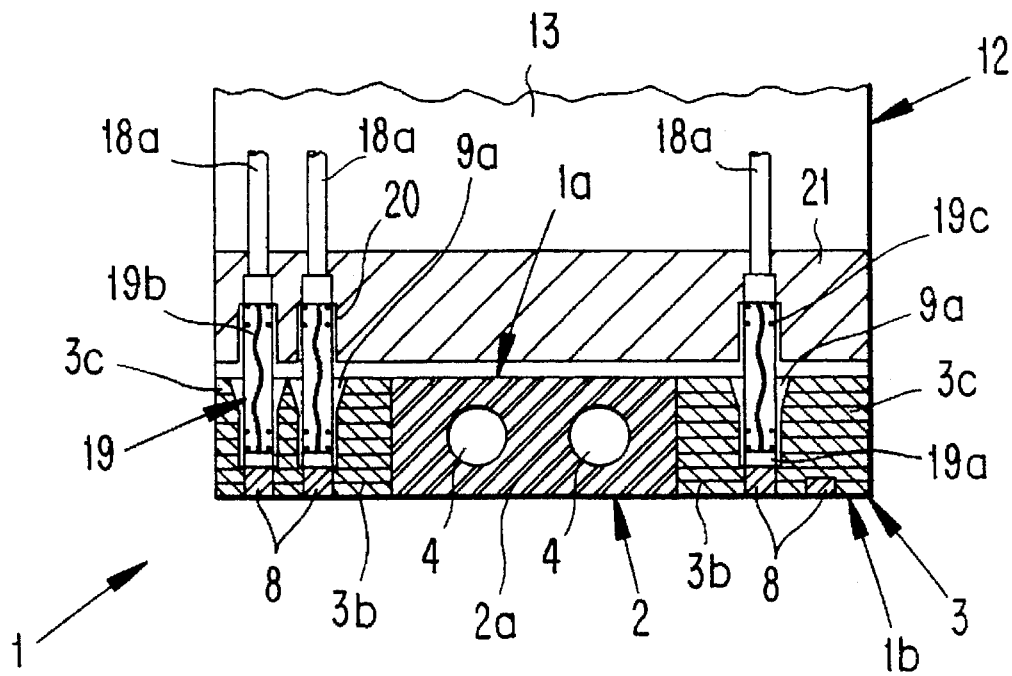
FIG. 5 is a partial cross-sectional view of a second embodiment of the device of the invention, taken along the line V—V of FIG. 2.
Figure 6:
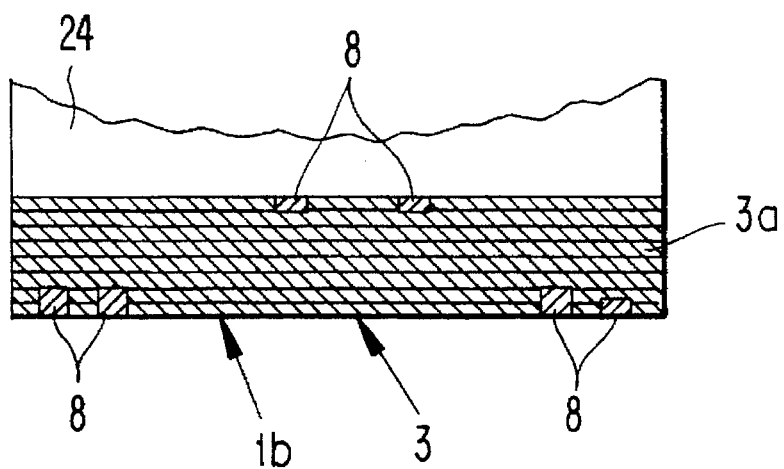
FIG. 6 is a partial cross-sectional view of the device of the invention, taken along the line VI—VI of FIG. 2.

These longitudinal grooves 6 and 7 are intended to receive bars 8 that feed energy and conduct electric current, the intensity of which is variable and can reach 300 A (see FIGS. 4 to 6).

The bars 8 can be embedded in these grooves 6, 7 or incorporated in the second, insulating part 3 during the duplicate moulding.

Perforations 9 extend through the thickness of the second, insulating part 3 and emerge at the level of their lower end in the longitudinal grooves 6. At the level of the upper face 1a, the perforations 9 present a diverging upper end shaped as a truncated-cone 9a, for example.

The upper face 1a of the support plate 1 includes internal screw threads 10 to receive the threaded lower ends of pins 11 (see FIG. 4) for attaching modules 12 on the support plate 1.

Each module 12 includes a base or platen 13 roughly in plate shape and oriented vertically on the drawings. These pins 11 have an elongated stem running through these bases 13 from top to bottom.

Of course, the pins 11 can be replaced by any other adapted suitable means of mechanical attachment, such as screws or the like.

With continued reference to FIG. 4, conduits 14 are formed in the base 13 so as to be able to be linked hydraulically to corresponding exit and entry openings 5 of the aforementioned pipes 4 so as to form a closed circuit for cooling fluid circulation. The arrows in FIG. 4 represent the cooling fluid circulation direction and path inside the conduits 14 in conformity with FIG. 1.

Gaskets 15 may be provided between the base 13 and the openings 5 to avoid any leaking of fluid at the level of their junction zones.

In FIG. 4, the conduits 14 are arranged so as to form a U-shaped circuit including an intermediate portion. That intermediate portion of the conduit 14 may be obtained by machining (e.g., drilling) with the opening being closed by a plug 16.

Cooling fluid circulating in the conduits 14 is intended to cool the modules 12 and in particular the electrical elements 17 (see FIG. 2) mounted on the corresponding bases 13. These electrical elements 17 are represented in diagram form in dot-and-dash lines in FIG. 2.

These electrical elements 17 are interchangeable and can be adapted to the different modules. As an example, one can cite choppers, converters, or chargers as electrical elements.

From FIG. 3, it will be seen that these electrical elements 17 can be mounted to each side of the base 13 and linked to the other electrical components by busbars 18. Those busbars 18 may also serve as means of attachment.

FIGS. 3 and 5 depict two embodiments of the invention. Each module 12 includes several electrical connectors 19 able to engage the corresponding perforations 9 of the support plate 1. The truncated conical end 9a of these perforations 9 functions to guide those electrical connectors 19 into the corresponding perforations 9a.

These electrical connectors 19 are connected by an electric line 18a (see FIG. 5) or a busbar 18 (see FIG. 3) to the associated electrical element 17 and assure the electrical connection between the electric elements 17 and the energy feeder-bars 8 (see FIG. 5).

Represented in FIG. 3 are connectors of the "Maréchal" type that comprise a braiding 19b running axially through a helical spring 19c which, in concert with the braiding, elastically connects a moveable or mobile base 19a of the connector 19 to one of the aforementioned electrical elements. The connector 19 is attached on a fixed, insulating base 21 and runs through it by a centering shaft 20.

Two connectors 19 of relatively large size in relation to three small connectors 19' with bases 19'a and of relatively small size may be provided. The larger connectors 19 serve to conduct the high-intensity currents while the smaller connectors 19' serve to conduct the weak operating currents, respectively.

One can also provide another connector 19 that can be detached so as to adapt each module 12 to the different electrical elements 17.

Also seen in FIG. 3 are holes 11a running through the base 13 and allowing the pins 11 (see FIG. 4) to pass through.

Internal screw threads 22 may be provided in the lateral tabs 2b of the first metal part2 for mechanical attachment of the support plate 1, in particular on an automobile.

Referring now to FIG. 2, a plug 23 may be arranged on one of the end portions 3a of the second, insulating part 3 at the level of the perforations 9 to supply energy to the different electric elements 17 as well as to other electrical components 17 by means of the metal conductor bars 8.

A main contactor 24 is arranged on the other end portion 3a at the level of the longitudinal grooves 7.

Also provided on the support plate 1 are sensors 25 to measure the intensity of the current circulating in the metal feeder-bars 8. These sensors 25 are arranged at the exit where these bars 8 emerge at the level of the upper face 1a.

An electric link interface 26 may be provided on the latter end portion 3a to connect the different bars 8 to other electric components.

A hydraulic connection interface 27 is arranged opposite the main exit and entry openings 5 that serve to supply the device of the invention with cooling fluid.

Figure 7:
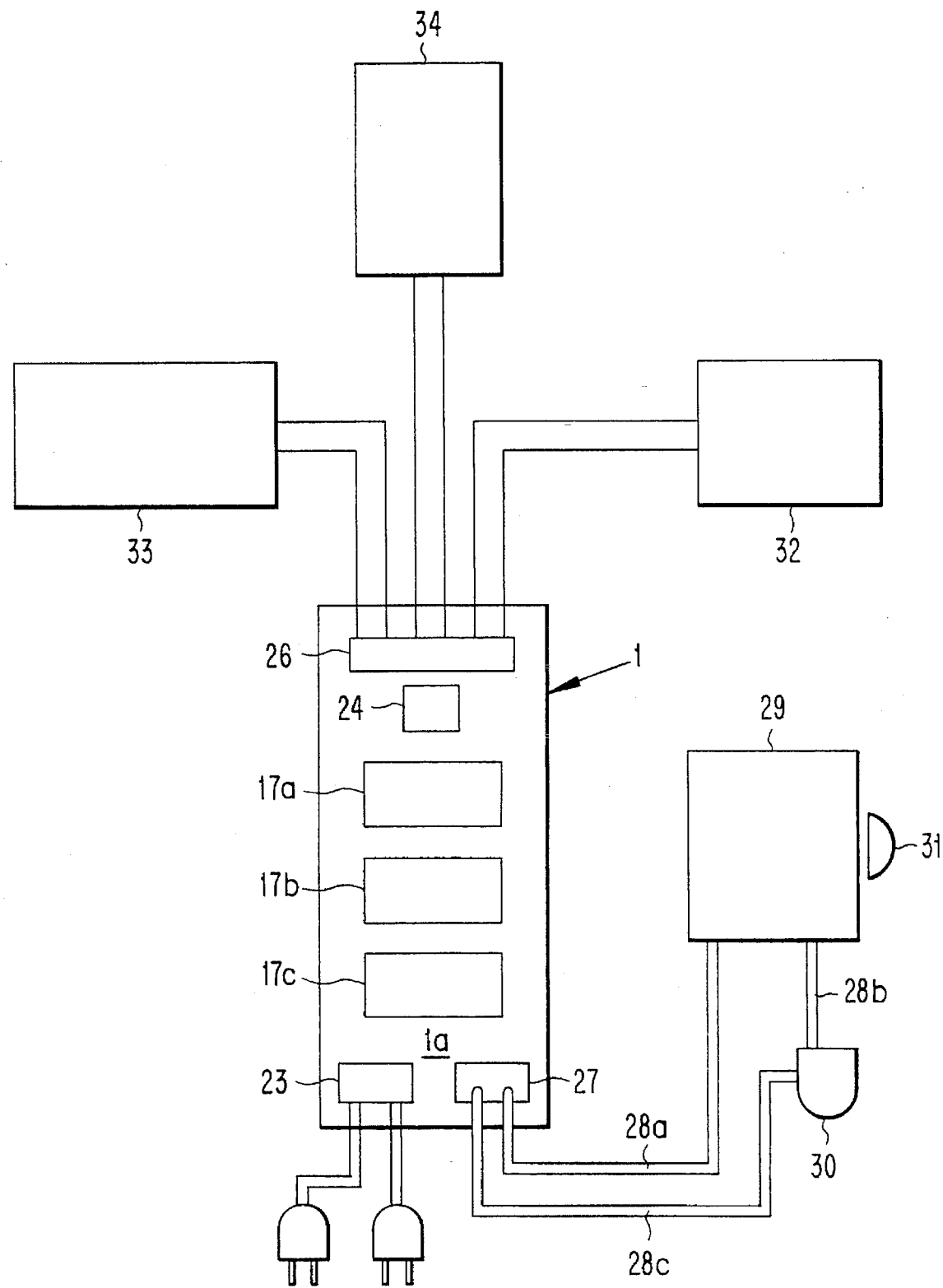
FIG. 7 is a block diagram of the device of the invention for an automobile.

We will now describe the operation of the device of the invention referring to the block diagram illustrated in FIG. 7.

Three electrical elements 17a, 17b and 17c representing choppers, a converter and a charger, respectively may be used.

The hydraulic connection interface 27 is connected by a pipe 28a to a cooling radiator 29 which is in turn connected by a pipe 28b to an auxiliary pump 30, with a pipe 28c connecting this auxiliary pump 30 to the hydraulic connection interface 27.

The pipes 28a and 28c are hydraulically connected to an entry opening and to an exit opening 5, respectively, of the network of hydraulic pipes or conduits 4.

The radiator 29 is cooled by a motor-driven fan 31.

The plug 23 is supplied with voltage, for example 220 V. It can gather together two supplies, one with stronger current, for example 200 A, and the other with weaker current, for example 16A.

The electrical link interface 26 may be connected to other components of an automobile, such as for example a motor 32, a main power battery 33, and an auxiliary battery 34.

The device of the invention is thus particularly adapted to vehicles with electric motor.

The device of the invention is constructed and arranged so as to be able to withstand the passage of high-intensity currents in the metal bars 8.

It clearly appears from the preceding that the different modules, and thus the electric elements, can be mounted and removed quickly and easily.

In addition, the device of the invention assures a good electric insulation vis-à-vis the external elements, since the electric feeder-bars 8 are integrated in an insulating material.

Although the invention has been described in connection with particular embodiments, it will be apparent to those skilled in the art that the invention is by no means limited to these embodiments. Moreover, it will be apparent to those skilled in the art that there are numerous modifications, variations, substitutions, and equivalents for various features of the invention that do not materially depart from the spirit and scope thereof. Accordingly, it is expressly intended that all such modifications, variations, substitutions, and equivalents for features of the invention which fall within the spirit and scope of the inventions defined by the appended claims be embraced thereby.

What is claimed is:

1. An operating and control device for an electric motor comprising:
   a plurality of electrical elements;
   a support supporting the plurality of electrical elements, the support including a metal part and an insulating part;
   a network of conduits formed in the metal part conveying a cooling fluid to the electrical elements;
   electrical links housed in the insulating part connecting the electrical elements to an energy source;
   wherein the support has a substantially planar top support surface, and wherein the insulating part and the metal part both form a part of the top support surface.

2. The operating and control device according to claim 1, further comprising:
   exit and entry openings on a top surface of the support communicating with the conduits in the metal part;
   electrical contact zones formed in the insulating part of the support for electrically connecting the plurality of electrical elements to the energy source and the other electrical elements; and
   support-bases provided on each of the electrical elements, the support-bases including conduits which communicate with the conduits in the metal part by the exit and entry openings, whereby each support-base belongs to a series of modules of predetermined shape which are sized to cover the exit and entry openings and electrical contact zones of the support.

3. The operating and control device according to claim 2, wherein each support-base comprises attachment means attaching at least one electrical element and attaching at least one electrical connector able to engage one of the contact zones to assure the electrical connection between the electrical elements and the electrical links.

4. The operating and control device according to claim 3, wherein the electrical connectors comprise a mobile base connected elastically via conductors to the electrical elements by means of springs and braidings.

5. The operating and control device according to claim 4, wherein each electrical contact zone includes a perforation emerging at one end on an electric link, an opposite end of the perforation diverging outwardly for guiding the bases of the electrical connectors.

6. The operating and control device according to claim 2, wherein the support comprises, on its upper face, means attaching the electrical element support-bases.

7. The operating and control device according to claim 2, wherein an upper surface of the insulating part has the same shape as a lower surface of the metal part.

8. The operation and control device according to claim 2, wherein the electrical links comprise metal bars and are embedded at least partially in grooves in the insulating part arranged on the external lower surface of the support.

9. The operating and control device according to claim 2, further including mechanical means for attachment of the support to an automobile.

10. The operating and control device according to claim 9, wherein the plurality of electrical elements include a battery of elements of electrical accumulators, whereby each element of the battery of elements is mounted on the support.

11. An operating and control device for an electric motor comprising:
    a support for supporting a plurality of electrical elements, the support including a metal part and an insulating part;

a network of conduits formed in the metal part for conveying a cooling fluid to the electrical elements;

electrical links housed in the insulating part for connecting the electrical elements to an energy source and to other electrical elements;

wherein the support has a substantially planar top support surface, and wherein the insulating part and the metal part both form a part of the top support surface.

12. The operating and control device according to claim 11, further comprising:

exit and entry openings on a top surface of the support communicating with the conduits in the metal part for hydraulically connecting the conduits with a plurality of cooling circuits formed in support-bases of the plurality of electrical elements;

electrical contact zones formed in the insulating part of the support for electrically connecting the plurality of electrical elements to the energy source, wherein the exit and entry openings and the electrical contact zones are within the support-bases of the electrical elements.

13. The operating and control device according to claim 12, further comprising means for attaching the support-bases of the electrical elements to the top surface of the support.

14. The operating and control device according to claim 11, wherein the insulating part includes grooves on a top surface of the insulating part and the metal part fits in the grooves of the insulating part.

* * * * *